United States Patent [19]
Lin et al.

[11] Patent Number: 6,060,360
[45] Date of Patent: *May 9, 2000

[54] METHOD OF MANUFACTURE OF P-CHANNEL EEPROM AND FLASH EEPROM DEVICES

[75] Inventors: Yai-Fen Lin, Taichung; Shiou-Hann Liaw, Hsin-Chu; Di-Son Kuo, Hsinchu; Juang-Ke Yeh, Hshin Chu Shian, all of Taiwan

[73] Assignee: Taiwan Semiconductor Manufacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/843,183

[22] Filed: Apr. 14, 1997

[51] Int. Cl.$^7$ .................................................. H01L 21/8247
[52] U.S. Cl. ........................................... 438/264; 438/594
[58] Field of Search ................... 438/257–267, 438/593, 594

[56] References Cited

U.S. PATENT DOCUMENTS

| | | |
|---|---|---|
| 4,249,968 | 2/1981 | Gardiner et al. . |
| 4,313,253 | 2/1982 | Henderson, Sr. .......................... 29/571 |
| 4,398,338 | 8/1983 | Tickle et al. . |
| 4,646,425 | 3/1987 | Owens et al. .............................. 29/571 |
| 4,816,883 | 3/1989 | Baldi ....................................... 357/23.5 |
| 4,992,391 | 2/1991 | Wang . |
| 5,089,866 | 2/1992 | Iwasa . |
| 5,147,813 | 9/1992 | Woo ......................................... 438/594 |
| 5,198,380 | 3/1993 | Harari ....................................... 437/43 |
| 5,260,593 | 11/1993 | Lee ........................................ 257/316 |
| 5,268,318 | 12/1993 | Harari ....................................... 437/43 |
| 5,445,982 | 8/1995 | Hwang ................................... 438/594 |
| 5,455,184 | 10/1995 | Tigelaar . |
| 5,482,880 | 1/1996 | Kaya et al. . |
| 5,616,942 | 4/1997 | Song ...................................... 257/316 |
| 5,650,649 | 7/1997 | Tsukiji .................................... 257/316 |
| 5,882,994 | 3/1999 | Araki et al. ............................. 438/593 |

*Primary Examiner*—Richard Booth
*Attorney, Agent, or Firm*—George O. Saile; Stephen B. Ackerman; Graham S. Jones, II

[57] ABSTRACT

A flash EEPROM or split gate flash EEPROM is made on a doped silicon semiconductor N-well formed in a doped semiconductor substrate. A channel with a given width is formed in the N-well which is covered with a tunnel oxide layer, and an N+ doped polysilicon floating gate electrode layer, which can be patterned into a split gate floating gate electrode having a narrower width than the channel width. An interelectrode dielectric layer is formed over the floating gate electrode and the exposed tunnel oxide. A control gate electrode includes a layer composed of P+ doped polysilicon over the interelectrode dielectric layer. The tunnel oxide layer, the floating gate electrode layer, the interelectrode dielectric layer, and the control gate electrode are patterned into a gate electrode stack above the channel. A source region and a drain region are formed in the surface of the substrate with a P type of dopant, the source region and the drain region being self-aligned with the gate electrode stack.

34 Claims, 9 Drawing Sheets

METHOD OF MANUFACTURE OF P-CHANNEL EEPROM AND FLASH EEPROM DEVICES

BACKGROUND OF THE INVENTION

1. Field of the Invention

This invention relates to EPROM memory devices and more particularly to enhancement mode EPROM and flash EEPROM devices and method of fabrication of such devices.

2. Description of Related Art

Two level polysilicon cells with a split or overlapping gate electrode are generally known and used in a variety of applications.

EPROM (Erasable Programmable Read Only Memory) FET devices provide long term retention of charge to store data. The charge is stored on a floating gate electrode which is not electrically connected to a terminal. Instead, the charge is supplied to the floating gate electrode through an insulator. The data may be erased by exposure of the device to ultraviolet light to erase the stored data by discharging the floating gate electrode.

EEPROM (Electrically Erasable Programmable Read Only Memory) FET devices can be erased by electrical means instead of exposure to ultraviolet light.

Flash EPROM devices are EEPROM FET devices with a double gate electrode structure including a floating gate electrode and a control gate electrode. The device includes a tunnel oxide dielectric layer between the substrate and the floating gate electrode by a thickness of about 100 Å and an interelectrode dielectric layer about 200 Å-250 Å thick composed of silicon oxide or ONO.

U.S. Pat. No. 4,313,253 of Henderson for "Method for Fabricating a Charge Transfer Channel Covered by a Stepped Insulating Layer" shows a P-channel, split gate electrode memory cell having double level polysilicon cell with heavily doped polysilicon conductors with a gate oxide layer having a thickness between 300 Å and 500 Å thick. While Henderson, generally describes a double level polysilicon cell split gate electrode fabrication, the provision of a tunnel oxide layer suitable for the type of Fowler-Nordheim tunneling employed in EPROM devices is not suggested.

U.S. Pat. No. 4,646,425 of Owens et al., "Method for Making a Self-Aligned CMOS EPROM Wherein the EPROM Floating Gate and CMOS Gates are Made from One Polysilicon Layer" shows an EPROM device with floating gate electrode and control gate electrodes which are formed of N+ doped polysilicon. The gate electrodes of the N-channel EPROM device are formed over a P-substrate and a gate oxide layer.

U.S. Pat. No. 5,198,380 of Harari for "Method of Making a Highly Compact EPROM and Flash EEPROM Devices" and U.S. Pat. No. 5,268,318 of Harari for "Highly Compact EPROM and Flash EPROM Devices" describe N-channel EPROM and Flash EEPROM devices devices with floating gate electrodes and control gate electrodes composed of heavily N+ doped polysilicon with the caveat that the control gate electrode can be a silicide.

U.S. Pat. No. 4,816,883 of Baldi for "Nonvolatile Semiconductor Memory Device" describes an N-channel device (in FIG. 13 thereof) of the kind seen in FIG. 3A herein without any description of what doping is applied to the polysilicon conductors. Baldi also shows (in FIG. 1 thereof) an N-channel EPROM device of the kind seen in FIG. 3A herein with a doped polysilicon floating gate electrode and control gate electrodes without any description of what doping is applied to the polysilicon conductors.

Overall, two level polysilicon cells with a split or overlapping gate electrode are generally known and used in a variety of applications.

P-channel EEPROM and Flash EPROM devices are prone to being depleted after CHE (Channel Hot Electron) injection.

SUMMARY OF THE INVENTION

The cell of Henderson U.S. Pat. No. 4,313,253 differs from the invention in the location of the sources and drains and function of the cell among other things.

This invention provides high speed, low voltages, low power consumption and less gate electrode disturbance.

The problem solved by this invention is to turn a P-channel nonvolatile device into an enhancement mode device which has advantages in circuit applications. Advantages of the P channel flash EPROM are as follows:

Hot electron injection current in P-channel flash EEPROM cell can be two orders of magnitude greater than in N-channel cell, while the channel current during programming in P-channel cell is two orders of magnitude less than in an N-channel cell.

In a split gate flash EEPROM device, the split gate flash EEPROM cell can be modelled as two transistors one of which is a programmable transistor with floating gate and a control gate in which there is a lower drain voltage, and there is no issue of overerasure.

The devices operate at high speed with low voltages, low power consumption and less gate electrode disturbance.

Some objects of this invention are as follows:
1. To combine P-channel nonvolatile and split-gate electrode Flash EPROM together.
2. Methods for solving the depletion issue in P-channel EEPROM and Flash EPROM and to increase the CHE injection in split-gate electrode Flash EPROM.

The present invention turns P-channel nonvolatile devices into enhancement mode which are more appropriate for circuit applications.

In accordance with this invention a method is provided for forming an FET semiconductor device, such as a flash EEPROM or a split gate device, in a doped silicon semiconductor substrate having a surface, the substrate being doped with a N type of dopant. The method includes the steps of forming a tunnel oxide layer over the substrate, forming a floating gate electrode layer including a layer of N+ doped polysilicon over the tunnel oxide layer, forming an interelectrode dielectric layer over the floating gate electrode, and forming a control gate electrode including a layer composed of P+ doped polysilicon over the interelectrode dielectric layer. Then follow the steps of patterning the tunnel oxide layer, the floating gate electrode layer, the interelectrode dielectric layer, and the control gate electrode into a gate electrode stack, and ion implanting a source region and a drain region in the surface of the substrate with a P type of dopant, the source region and the drain region being self-aligned with the gate electrode stack of the split gate FET semiconductor device. Preferably, the floating gate has a thickness from about 1,000 Å to about 1,200 Å.

It is also preferred that the floating gate electrode layer is a laminated structure comprising a lower polysilicon layer having a thickness from about 1,000 Å to about 1,200 Å; an N+ doped polysilicon layer formed on the lower polysilicon layer having a thickness from about 1,000 Å to about 1,200 Å, and an upper polysilicon layer having a thickness from about 2,000 Å to about 3,000 Å. The tunnel oxide layer has a thickness from about 90 Å to about 100 Å; and the source/drain dopant comprises P type dopant ions of boron fluoride, $BF_2$, ion-implanted at an energy from about 30 keV to about 60 keV with a dose from about 1 E 15 ions/cm² to about 5 E 15 ions/cm². The substrate was doped by N type dopant comprising ions of phosphorus, P, ion-implanted at an energy from about 70 keV to about 100 keV with a dose from about 7 E 12 ions/cm² to about 1.4 E 13 ions/cm².

A device in accordance with this invention comprises a split gate FET semiconductor device formed on a doped silicon semiconductor substrate having a surface, the substrate being doped with a N type of dopant, the device having a channel, the channel having a channel width, a tunnel oxide layer over the substrate, a floating gate electrode layer including a layer of N+ doped polysilicon over the tunnel oxide layer, patterning the floating gate electrode layer into a split gate floating gate electrode have a narrower width than the channel width, an interelectrode dielectric layer over the floating gate electrode and the exposed portion of the tunnel oxide, a control gate electrode including a layer composed of P+ doped polysilicon over the interelectrode dielectric layer, patterning the tunnel oxide layer, the floating gate electrode layer, the interelectrode dielectric layer, and the control gate electrode into a gate electrode stack above the channel, and ion implanting a source region and a drain region in the surface of the substrate with a P type of dopant, the source region and the drain region being self-aligned with the gate electrode stack. The floating gate has a thickness from about 1,000 Å to about 1,200 Å.

Preferably, the floating gate electrode layer is a laminated structure comprises a lower polysilicon layer having a thickness from about 1,000 Å to about 1,200 Å, an N+ doped polysilicon layer formed on the lower polysilicon layer having a thickness from about 1,000 Å to about 1,200 Å, and an upper polysilicon layer having a thickness from about 2,000 Å to about 3,000 Å. The tunnel oxide layer has a thickness from about 90 Å to about 100 Å, and the source/drain dopant comprises P type dopant atoms of boron fluoride, $BF_2$, with a concentration from about 1 E 18 atoms/cm³ to about 1 E 20 atoms/cm³. The substrate is doped by N type dopant comprising atoms of phosphorus, P, with a concentration from about 1 E 16 atoms/cm³ to about 5 E 17 atoms/cm³.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 2A:
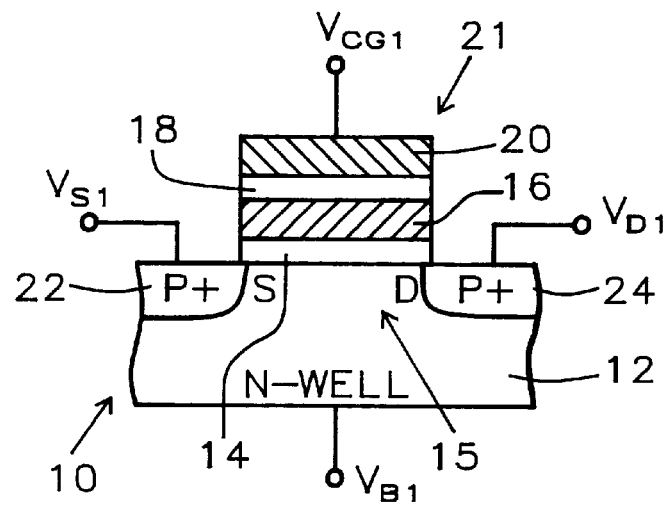
FIG. 2A shows a Flash EEPROM, including a silicon semiconductor substrate comprising an N-Well in which source/drain regions are formed with a channel region therebetween.

FIG. 2A shows a Flash EEPROM 10, including a silicon semiconductor substrate comprising an N-Well 12, (doped with N− dopant) in which source/drain regions 22/24 are formed with a channel region 15 therebetween. Located on the surface of the N-well 12 is a gate electrode stack 21. Stack 21 includes a tunnel oxide layer 14 formed on the surface of the N-well 12, a floating gate electrode 16 formed on the surface of the tunnel oxide layer 14, an interelectrode dielectric layer 18 formed on the surface of the floating gate electrode 16 and a control gate electrode 20 formed on the surface of the interelectrode dielectric layer 18. Control gate electrode 20 is connected to the voltage source $V_{CG1}$. The P+ doped source region 22 is connected to the voltage source $V_{S1}$. The P+ doped drain region 24 is connected to the voltage source $V_{D1}$.

The programming voltages for the device of FIG. 2A are shown in Table I below.

TABLE I

|  | $V_{CG1}$ | $V_{D1}$ | $V_{S1}$ | $V_{B1}$ |
|---|---|---|---|---|
| WRITE | −5V | −8V | GND | GND |
| ERASE | −11V | 5V | FLOATING | GND |

Figure 2B:
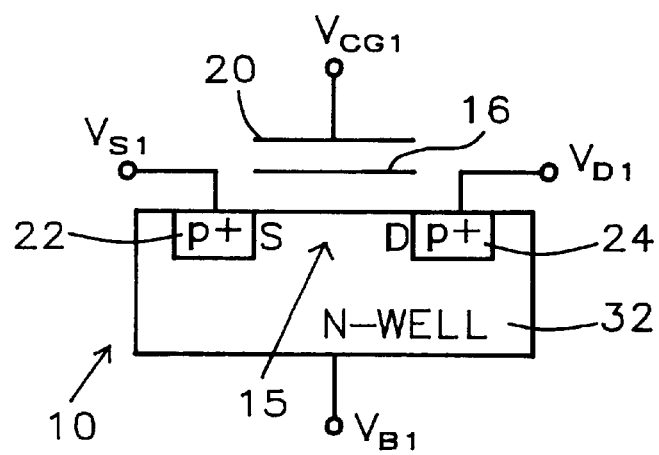
FIG. 2B shows the equivalent schematic diagram of the device of FIG. 2A.

FIG. 2B shows the equivalent schematic diagram of the device 10 FIG. 2A which is adapted for hot electron injection into the floating gate electrode 16. However, the device 10 of FIG. 2A is prone to being depleted after CHE (Channel Hot Electron) programming and depleted devices are difficult to design in many applications.

Figure 1A:
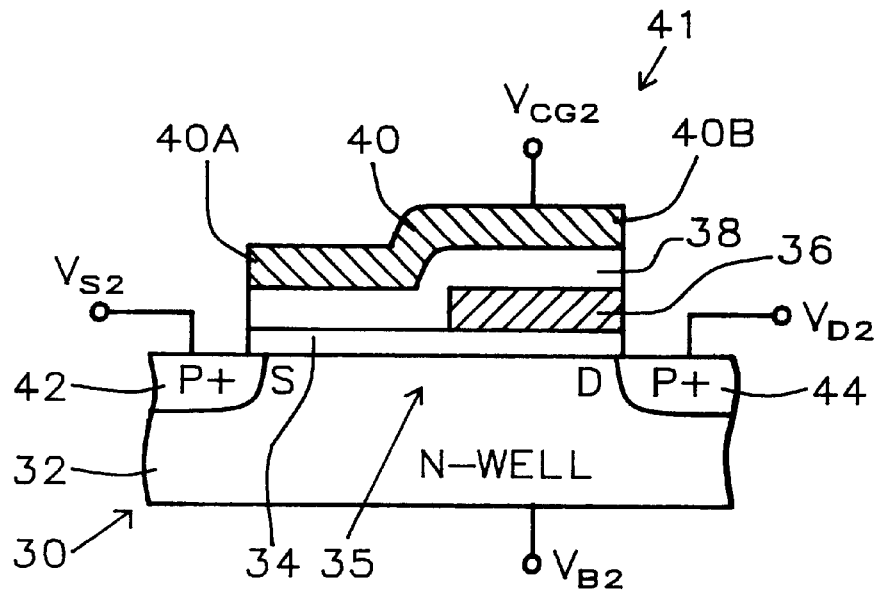
FIG. 1A shows a sectional view of a flash EEPROM device in accordance with this invention which combines the features of both a split-gate electrode device and a P-channel device together to overcome the depletion issue.

FIG. 1A shows a sectional view of a flash EEPROM device 30 in accordance with this invention which combines the features of both a split-gate electrode device and a P-channel device together to overcome the depletion issue.

Figure 1B:
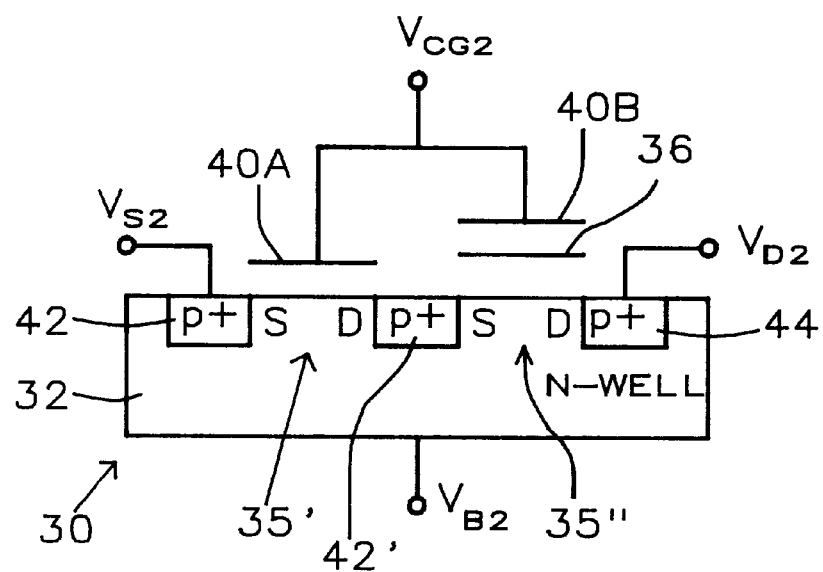
FIG. 1B shows an equivalent schematic circuit diagram of the device of FIG. 1A.

FIG. 1B shows an equivalent schematic circuit diagram of the device of FIG. 1A.

The flash EEPROM device 30 has larger CHE (Channel Hot Electron) current during programming because of a large electric field in the channel for its structure. The P-channel, enhancement mode, split-gate electrode Flash EEPROM device 30, shown in FIGS. 1A and 1B, provides a higher channel hot-electron injection rate with a successful design in which hot electron injection current in a P-channel cell can be two orders of magnitude greater than in an N-channel cell, while the channel current during programming in a P-channel cell is two orders of magnitude less than in an N-channel cell.

The split gate electrode flash EEPROM 30 of FIG. 1A is formed on a portion of an N-Well 32 in a semiconductor substrate. Formed in N-Well 32 are P+ doped source/drain regions 42/44 with a channel region 35 therebetween. Flash EEPROM 30 also includes a gate electrode stack 41 formed on the surface of the N-Well 32 above the channel region 35.

The gate electrode stack 41 which overlies a tunnel oxide layer 34 formed on the surface of the N-Well 32 (above the channel region 35). Stack 41 includes a floating gate electrode 36, interelectrode dielectric layer 38, and a split gate control gate electrode 40.

The floating gate electrode 36 formed on the surface of the tunnel oxide layer 34 extends partially across channel 35. The interelectrode dielectric layer 38 overlies the top surface of the floating gate electrode 36. The control gate electrode 40 overlies the top surface of the interelectrode dielectric layer 38 above the floating gate electrode 36 and extends further to overlie the top surface of the tunnel oxide layer 34 beyond the end of the floating gate electrode 36 which is composed of a polysilicon conductor heavily doped with N+ dopant. The control gate electrode 40 is also a heavily doped polysilicon conductor, but it is doped with P+ (polarity) type dopant. Thus, in this design the floating gate polysilicon layer 36 is doped oppositely from the control gate electrode polysilicon layer 40 and the floating gate polysilicon layer 36 is doped with the same type (polarity) of dopant as the channel 35. The split gate control gate electrode 40 includes a section 40A over the tunnel oxide layer 34 and a section 40B over the interelectrode dielectric layer 38.

The programming voltages for the device of FIG. 1A are shown in Table II below.

TABLE II

|  | $V_{CG2}$ | $V_{D2}$ | $V_{S2}$ | $V_{B2}$ |
|---|---|---|---|---|
| WRITE | −5V | −5V | GND | GND |
| ERASE | −10V | 5V | X | 5V |

The Split-Gate Flash EPROM cell of FIG. 1A can be modelled as two transistors. Even a lower drain voltage can be obtained and there is no issue of overerasure.

Figure 1C:
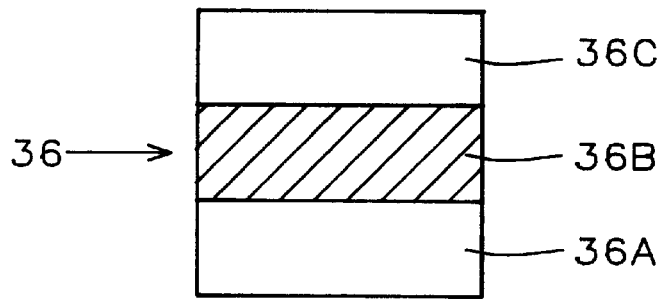
FIG. 1C shows a laminated structure as shown in which the lower layer of the floating gate of FIG. 1A is an undoped polysilicon layer, the intermediate layer is a doped polysilicon layer, and the upper layer is an undoped polysilicon layer.

Preferably, the floating gate electrode 36 of FIG. 1A comprises a laminated structure as shown in FIG. 1C in which the lower layer 36A is an undoped polysilicon layer (having a thickness from about 1,000 Å to about 1,200 Å), the intermediate layer 36B is an N+ doped polysilicon layer formed on said lower polysilicon layer 36A (having a thickness from about 1,000 Å to about 1,200 Å), and an undoped upper polysilicon layer 36C having a thickness from about 2,000 Å to about 3,000 Å.

The material formed into control gate electrode 40 can be a conventional polycides, i.e. a metal silicide, for electrodes of the kind employed in FET devices. Such polycides are a combination of polysilicon and silicides. A typical polycide has a lower level of polysilicon with an upper level of silicide. They have the positive features that both layers exhibit good stability, adherence, and coverage (from the polysilicon) and a high conductivity path from the silicide. The first layer comprises a material selected from polysilicon and a polycide selected from the group consisting of $WSi_2$, $TiSi_2$, $CoSi_2$, and $MoSi_2$. The second layer comprises a material selected from polysilicon and a polycide selected from the group consisting of $WSi_2$, $TiSi_2$, $CoSi_2$, $MoSi_2$, and $TaSi_2$.

The control gate electrode 40 is connected to the voltage source $V_{CG2}$. The P+ source region 42 is connected to the voltage source $V_{S2}$. The P+ drain region 44 is connected to the voltage source $V_{D2}$.

FIG. 1B shows the equivalent schematic diagram of the device of FIG. 1A. This device 30 is adapted to use for hole injection into the floating gate electrode 36.

However, the device 10 of FIG. 2A is prone to being depleted after CHE (Channel Hot Electron) programming. Depleted devices are difficult to design in many applications.

The equivalent circuit of FIG. 1B includes a pair of FET transistors with one of those transistors (on the left) comprising a P-channel FET with a control gate electrode 40A and an EPROM device with a floating gate electrode 36 and a control gate electrode 40B. In the substrate 32 are the source region 42, the drain region 44 and an equivalent drain/source region 42'.

Figure 3A:
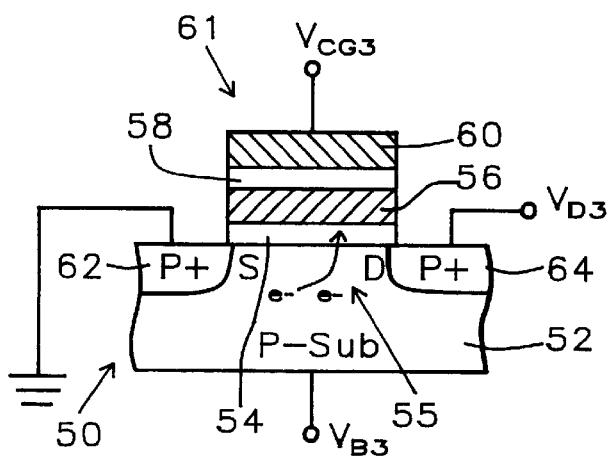
FIG. 3A shows a sectional view of an N-channel EPROM including a P-doped substrate in which source/drain regions are formed, the EPROM including source/drain regions formed in the P-substrate.

An N-channel EPROM 50 of FIG. 3A includes a P-doped substrate 52 in which source/drain regions 62/64 are formed with a channel region 55 therebetween. EPROM 50 includes source/drain regions 62/64 formed in the P-substrate 52 and also includes gate electrode stack 61 formed above the channel region 55 on the surface of the substrate 52. Located on the surface of the P-substrate 52 is a gate electrode stack 61 comprising a tunnel oxide layer 54, a floating gate electrode 56, an interelectrode dielectric layer 58 and control gate electrode 60 which is connected to the voltage source $V_{CG3}$. The P+ source region 62 is connected to ground. The P+ drain region 64 is connected to the voltage source $V_{D3}$. This device 50 is adapted to use for hot electron injection into the floating gate electrode 56. However, the device 50 is prone to being depleted after CHE (Channel Hot Electron)

programming. Depleted devices of the kind shown in FIG. 3A are difficult to design in many applications.

Figure 3B:
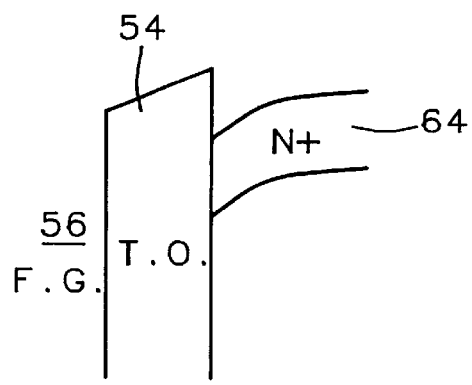
FIG. 3B shows an energy band diagram for the EPROM device of FIG. 3A.

FIG. 3B shows an energy band diagram for the device 50 of FIG. 3A. To the left is the floating gate 56. In the center is the tunnel oxide (T.O.) region 54 with the N+ drain region 64 to the right. It can be seen that the gap from region 54 to region 64 is relatively low compared to that seen in FIG. 4C below.

The programming voltages for the device of FIG. 3A are shown in Table III below.

TABLE III

|  | $V_{CG3}$ | $V_{D3}$ | $V_{S3}$ | $V_{B3}$ |
|---|---|---|---|---|
| WRITE | 11V | 6V | 0V | 0V |
| ERASE | −11V | 5V | X | 0V |

Figure 4A:
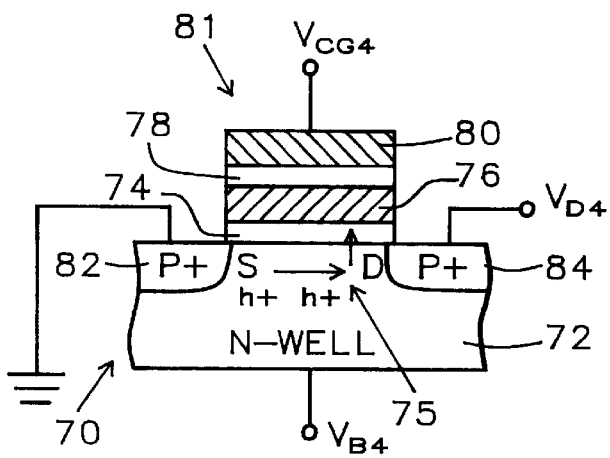
FIG. 4A shows a sectional view of a P-channel stacked-gate electrode Flash EPROM including source/drain regions formed in the P-substrate and also includes a gate electrode stack formed above the channel region on the surface of the substrate.

Referring to FIG. 4A herein, consider a P-channel stacked-gate electrode Flash EPROM device 70. Flash EPROM device 70 includes source/drain regions 82/84 formed in the N-well 72 and also includes gate electrode stack 81 formed above the channel region 75 on the surface of the N-well 72. Flash EPROM device 70 is intended to have a higher channel hot-electron injection rate of the kind seen in FIG. 3A. However, the device 50 of FIG. 3A is prone to being depleted after CHE (Channel Hot Electron) programming. Depleted devices are difficult to design in many applications. Between the source/drain regions 82/84 of flash EEPROM device 70 in N-Well 72 is a channel region 75. Located on the surface of the N-well 72, between source/drain regions 82/84 is formed a gate electrode stack of tunnel oxide layer 74, floating gate electrode 76, inter-electrode dielectric layer 78 and control gate electrode 80 which is connected to the voltage source $V_{CG4}$. The P+ source region 82 is connected to ground (reference potential). The P+ drain region 84 is connected to the voltage source $V_{D4}$.

Figure 4C:
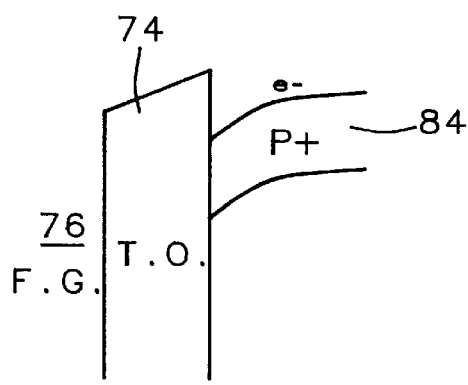
FIG. 4C shows an energy band diagram for the EPROM device of FIG. 4A.
Figure 4B:
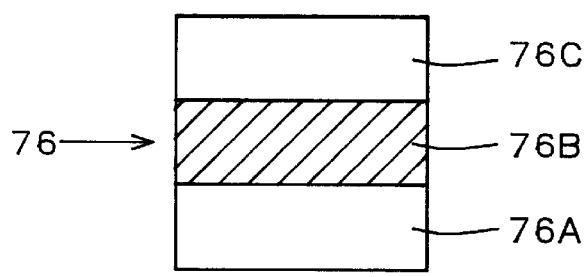
FIG. 4B shows a laminated structure as shown in which the lower layer of the floating gate of FIG. 1A is an undoped polysilicon layer, the intermediate layer is a doped polysilicon layer, and the upper layer is an undoped polysilicon layer.

The floating gate electrode 76 is preferably a laminated structure as shown in FIG. 4B in which the lower layer 76A is an undoped polysilicon layer (having a thickness from about 1,000 Å to about 1,200 Å), the intermediate layer 76B is an N+ doped polysilicon layer formed on said lower polysilicon layer 76A (having a thickness from about 1,000 Å to about 1,200 Å), and an undoped upper polysilicon layer 76C having a thickness from about 2,000 Å to about 3,000 Å.

FIG. 4C shows an energy band diagram for the device of FIG. 4A. To the left is the floating gate 76. In the center is the tunnel oxide (T.O.) region 74 with the P+ drain region 84 to the right. It can be seen that the gap from region 74 to region 84 is higher.

The programming voltages for the device of FIG. 4A are shown in Table IV below.

TABLE IV

|  | $V_{CG4}$ | $V_{D4}$ | $V_{S4}$ | $V_{B4}$ |
|---|---|---|---|---|
| WRITE | −5V | −8V | 0V | 0V |
| ERASE | −11V | 5V | X | 0V |

Figure 7:
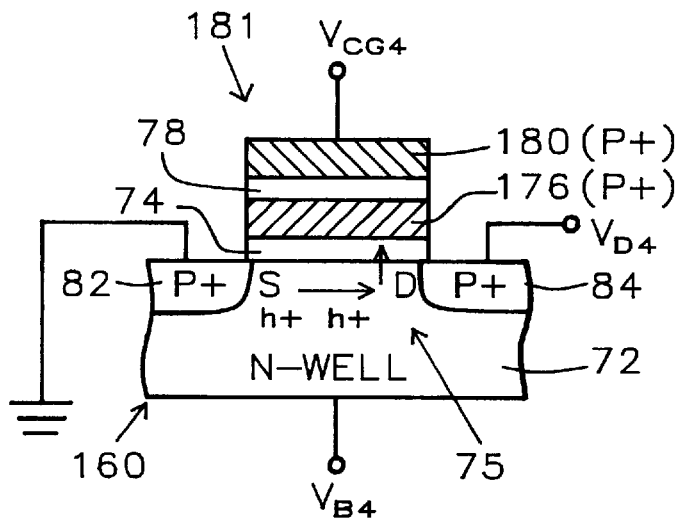
FIG. 7 shows a modified version of FIG. 4A in which a P-channel device is shown with P+ doped S/D regions and a N-doped well to have a floating gate electrode and a control gate electrode which are formed of polysilicon heavily doped with P+ dopant.

Referring to FIG. 7, which is a first modified version of FIG. 4A (where like elements have like reference numbers), a P-channel device 160 is shown with P+ doped S/D regions 82/84 and a N-doped well 72. Device 160 includes a floating gate electrode 176 and a control gate electrode 180 which are formed of polysilicon heavily doped with P+ dopant. The problem with this design is that doping of boron into the floating gate electrode 176 is prone to diffuse into the tunnel oxide layer 74.

Figure 8:
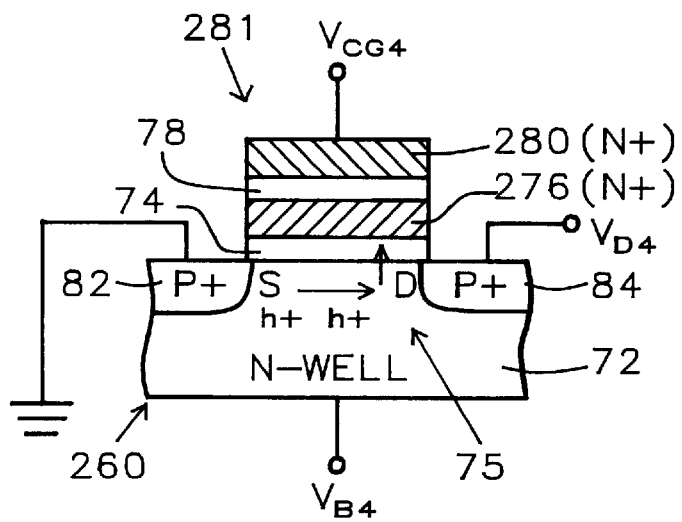
FIG. 8 shows another modified version of FIG. 4A in which an N-channel device is shown with N+ doped S/D regions and a N-doped well to have a floating gate electrode and a control gate electrode which are formed of polysilicon heavily doped with N+ dopant.

Referring to FIG. 8, which is second modified version of FIG. 4A (where like elements have like reference numbers), an N-channel device 260 is shown with N+ doped S/D regions 82/84 and a N-doped well 72 to have a floating gate electrode 276 and a control gate electrode 280 which are formed of polysilicon heavily doped with N+ dopant. The problem with this design is the higher work function difference which leads to a more complex process of adjusting of Threshold Voltage ($V_T$).

Figure 9:
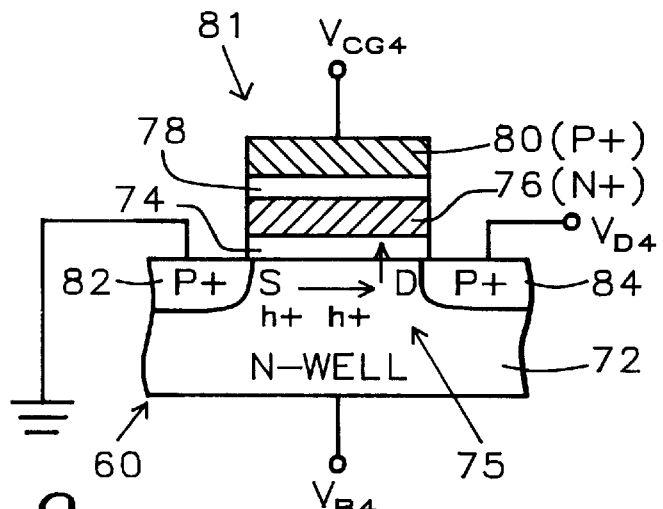
FIG. 9 shows a version of FIG. 4A in which the P-channel device has a P+ doped S/D regions and a N-doped well with a N+ heavily doped floating gate electrode and a P+ heavily doped control gate electrode which are formed of polysilicon heavily doped with N+ dopant.

Referring to FIG. 9, which is a third modified version of FIG. 4A (where like elements have like reference numbers), the P-channel flash EPROM device 70 has a P+ doped S/D regions 82/84 and a N-doped well 72 with a N+ heavily doped floating gate electrode 76 and a P+ heavily doped control gate electrode 80 which are formed of polysilicon heavily doped with N+ dopant. Since the work function $\Phi_{ms1}$=+1 for the N+ floating gate electrode 76, and the work function $\Phi_{ms2}$=−1 for the P+ control gate electrode 80 the result is that the overall work function between the control gate electrode and the P-channel is as follows:

$$\Phi_{ms} = \Phi_{ms1} + \Phi_{ms2}$$

$$\Phi_{ms} = (+1) + (-1) = 0$$

Thus the device is an enhancement device and there is no need to adjust Threshold Voltage (VT) because the work function difference is "0" between the control gate electrode and the substrate. In other words, with a P-channel transistor, an N+ doped floating gate electrode ($\Phi_{ms1}$=+1) and a P+ doped control gate electrode ($\Phi_{ms2}$=−1) the overall Φms (work function) difference between CG and P-channel equals 0.

Process of Manufacture of Split Gate EEPROM Device

FIGS. 5A–5I are cross-sectional views showing a process for manufacturing a portion of a CMOS semiconductor device 30 of FIG. 1A in accordance with this invention. As is conventional in this art, in order to simplify the description, the structure of only one memory FET device 30 is shown, but those skilled in the art will understand how this invention fits into the context of an overall device.

Figure 5A:
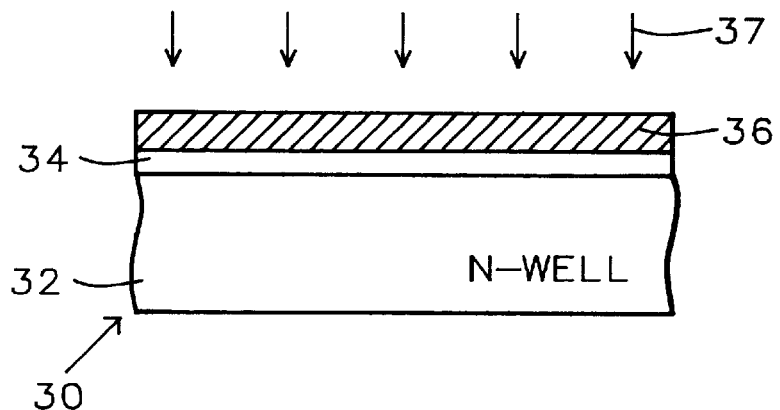
FIGS. 5A–5I are cross-sectional views showing a process for manufacturing a portion of a CMOS semiconductor device of FIG. 1A in accordance with this invention.

Referring to FIG. 5A, a sectional view of the device 30 is shown in a very early stage of manufacture starting with a silicon semiconductor N-doped well 32. A tunnel oxide layer 34 having a thickness from about 90 Å to about 100 Å is formed on a major surface of the N-well 32 by thermal oxidation.

Next, a blanket layer to be patterned into a floating gate electrode 36, preferably comprising a polysilicon film from about 1,000 Å thick to about 1,200 Å thick, has been formed on the overall surface of the tunnel oxide layer 34 and then doped with phosphorus, N type, dopant 37 into layer 36 by a conventional method.

Figure 5B:
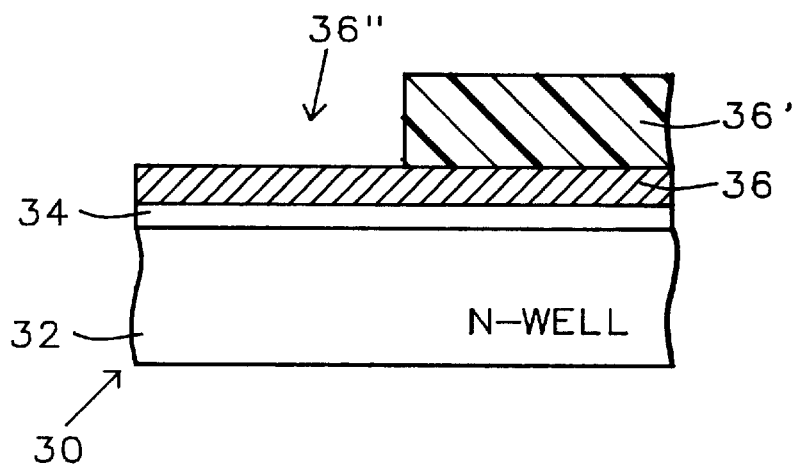

Referring to FIG. 5B, a photoresist mask 29 is then formed on the polysilicon film 36 in the region where the FET of this invention is to be formed. The photoresist mask 36' is patterned by photolithography, with openings 36" everywhere in FIG. 5B except where the floating gate 36 of a split gate electrode stack 41 is to be formed. Thereafter, below openings 36" the polysilicon film 36 is etched away (through the openings 36" in the photoresist mask 36') down to the tunnel oxide layer 34.

Figure 5C:
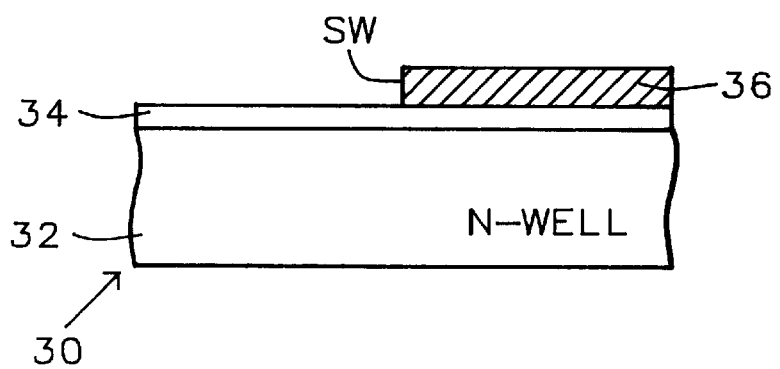

The photoresist mask 36' is then removed leaving the device 30 as seen in FIG. 5C with the N-well 32 covered by the tunnel oxide layer 34 upon which the floating gate electrode 36 has been formed with an exposed sidewall SW.

Figure 5D:
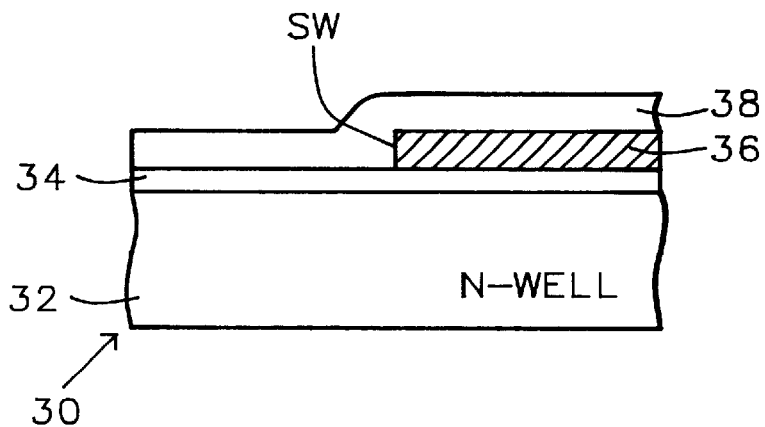

FIG. 5D shows the device 30 of FIG. 5C after an interelectrode dielectric layer 38 has been formed over the surface of floating gate electrode 36 and stepping down over the sidewall SW of the floating gate electrode 36 over the exposed surface of tunnel oxide layer 34. The interelectrode dielectric layer 38 has a thickness from about 200 Å thick to about 220 Å thick over the surface of the N-well 32. Interelectrode dielectric layer 38 is preferably composed of silicon oxide.

Figure 5E:
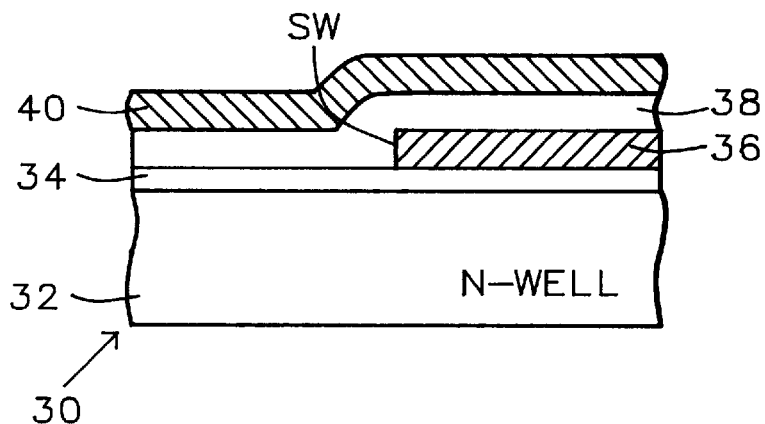

FIG. 5E shows the device 30 of FIG. 5D after formation of a control gate electrode conductor layer 40 from about 2,000 Å thick to about 3,000 Å thick has been formed on the overall surface of the interelectrode dielectric layer 38 reaching down over the sidewall conformally with the interelectrode dielectric layer 38.

Figure 5F:
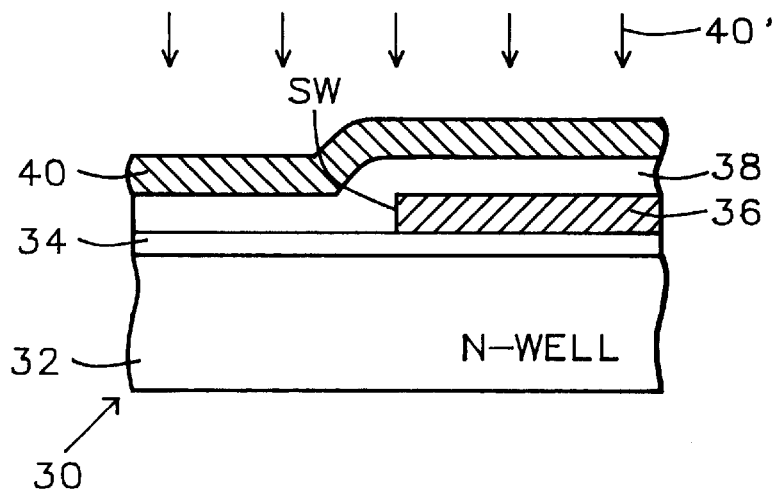

FIG. 5F shows the device 30 of FIG. 5E, which assumes that layer 40 comprises a second polysilicon layer, in which case polysilicon layer 40 is being counterdoped with boron fluoride ($BF_2$) P type dopant 40'.

Figure 5G:
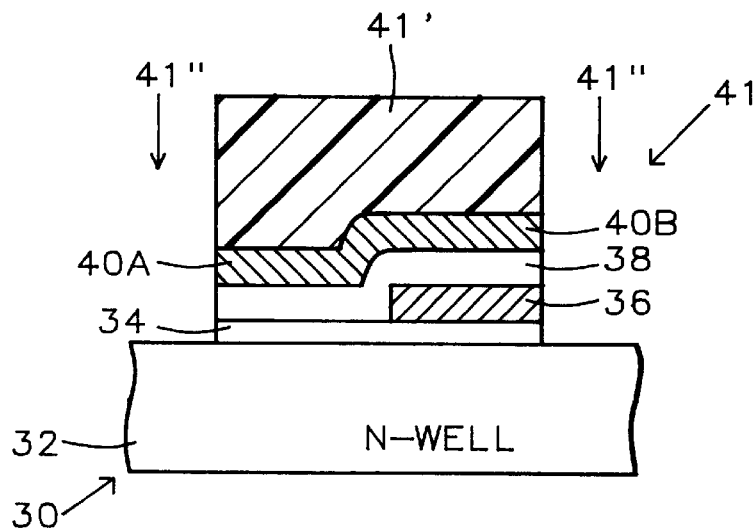

FIG. 5G shows the device 30 of FIG. 5F after a mask 41' with gate electrode stack openings 41" therethrough is formed on the device 30. The gate electrode stack 41 is then formed by etching away exposed portions of control gate electrode conductor layer 40, interelectrode dielectric layer 38, floating gate electrode 36 (unprotected by mask 41') and tunnel oxide layer 34 down to the surface of the N-well 32.

Figure 5H:
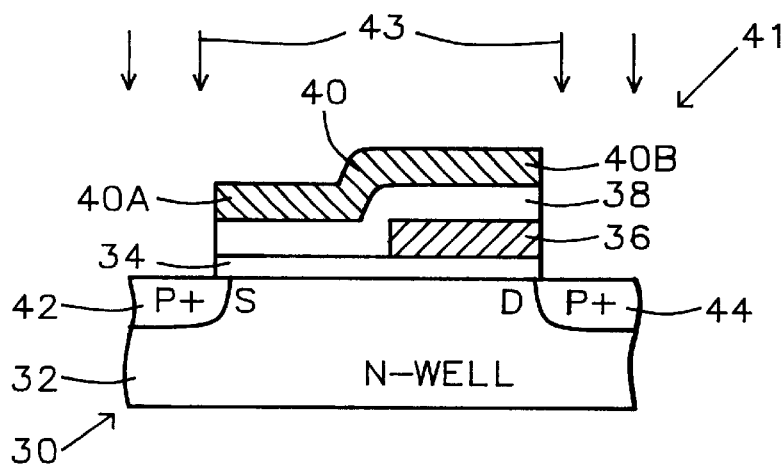

FIG. 5H shows the device 30 of FIG. 5G after a mask 41' has been stripped away and showing doping with source/drain dopant 43 comprising boron fluoride ($BF_2$) ion-implanted into the source/drain regions 42/44 in N-well 32 (at an energy from about 30 keV to about 60 keV with a dose from about 1 E 15 ions/cm$^2$ to about 5 E 15 ions/cm$^2$). The gate electrode stack 41 of polysilicon film 40, dielectric layer 38, floating gate electrode 36 and tunnel oxide layer 34 serve as a self-aligned mask in forming the N+ source/drain regions 42/44 in the P-well 32. After annealing, the source/drain regions 42/44 have a concentration of P+ dopant from about 1 E 18 atoms/cm$^3$ to about 1 E 20 atoms/cm$^3$. The source/drain regions 42/44 are symmetrically self-aligned with the gate electrode stack 41.

Figure 5I:
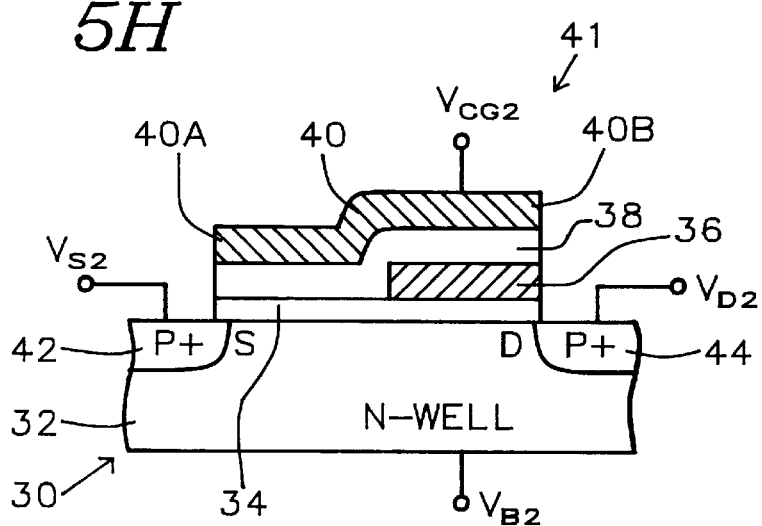

FIG. 5I shows the device 30 of FIG. 5H after the subsequent steps in completion of the device 30 seen in FIG. 1A with the terminals connected to the device as described in connection with FIG. 1A.

Then the back end of the line steps follow completing the device 30 as will be well understood by those skilled in the art.

Process of Manufacture of P-Channel EEPROM Device

FIGS. 6A–6F are cross-sectional views showing a process for manufacturing a portion of a CMOS semiconductor flash EPROM device 70 of FIG. 4A in accordance with this invention. As is conventional in this art, in order to simplify the description, the structure of only one memory FET flash EPROM device 70 is shown, but those skilled in the art will understand how this invention fits into the context of an overall device.

Figure 6A:
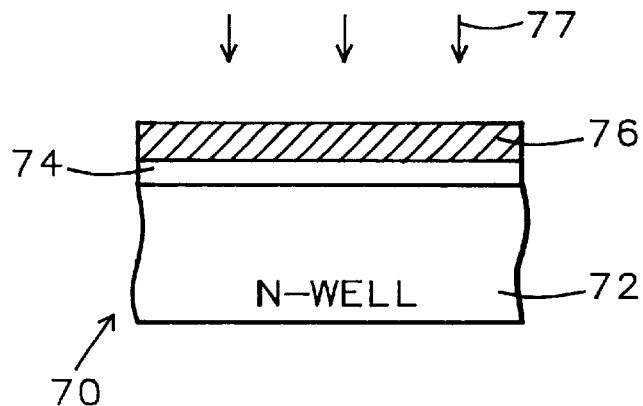
FIGS. 6A–6F are cross-sectional views showing a process for manufacturing a portion of a CMOS semiconductor device of FIG. 4A in accordance with this invention.

Referring to FIG. 6A, the flash EPROM device 70 is shown in a very early stage of manufacture starting with a silicon semiconductor N-doped well 72. A tunnel oxide layer 74 having a thickness from about 90 Å to about 100 Å is formed on a major surface of the N-well 72 by thermal oxidation.

Next, a floating gate electrode layer 76, preferably comprising a polysilicon film from about 1,000 Å thick to about 1,200 Å thick, has been formed on the overall surface of the tunnel oxide layer 74 and then doped with phosphorus (P) N+ type dopant 77.

It is also possible for the layer 76 to be a laminated layer of undoped polysilicon/doped polysilicon/undoped polysilicon layers as described above with reference to FIG. 1C and FIG. 4B.

Figure 6B:
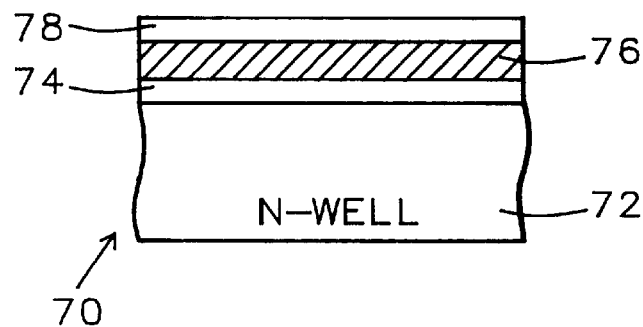

FIG. 6B shows the flash EPROM device 70 of FIG. 6A after an interelectrode dielectric layer 78 has been formed over floating gate electrode 76 and the exposed surface of tunnel oxide layer 74. The interelectrode dielectric layer 78 has a thickness from about 200 Å thick to about 220 Å thick over the surface of the N-well 72. Preferably, the interpolysilicon dielectric layer 78 is composed of ONO (silicon Oxide/silicon Nitride/silicon Oxide).

Figure 6C:
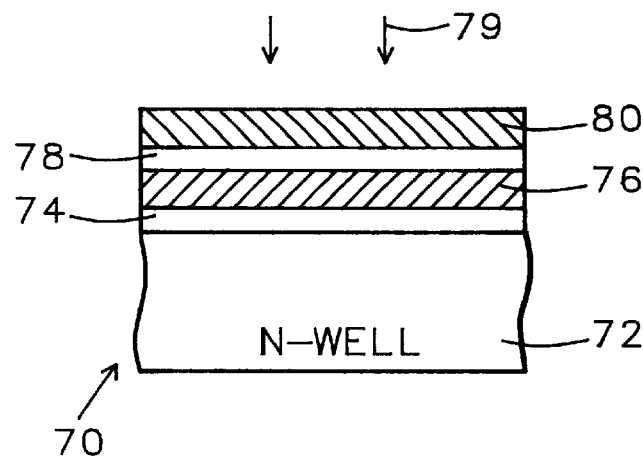

FIG. 6C shows the flash EPROM device 70 of FIG. 6B after formation of a control gate electrode conductor layer 80 from about 200 Å thick to about 300 Å thick has been formed on the overall surface of the tunnel oxide layer 74. The flash EPROM device 70 of FIG. 4A and FIG. 9, assumes that layer 80 comprises a second polysilicon layer, in which case polysilicon layer 80 is counterdoped with boron fluoride ($BF_2$) P+ type dopant 79 having a concentration of P+ dopant.

Figure 6D:
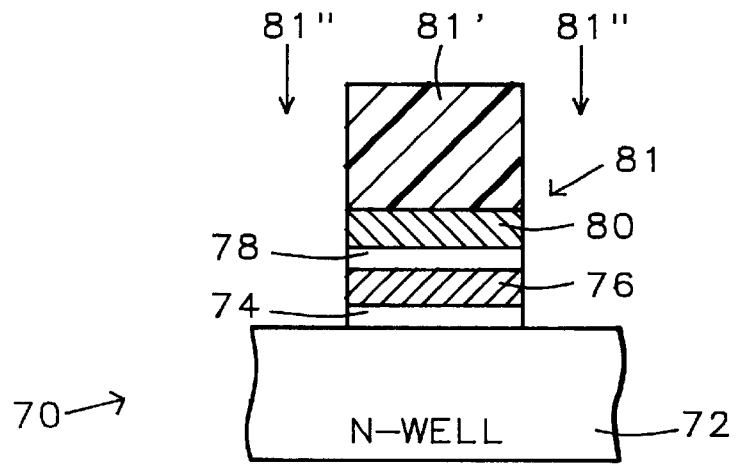

FIG. 6D shows the flash EPROM device 70 of FIG. 6C after a mask 81' with gate electrode stack openings 81" therethrough is formed on the EPROM device 70. The gate electrode stack 81 is then formed by etching away the unwanted portions of gate electrode stack 81 through the control gate electrode layer 80, the interelectrode dielectric layer 78 and the floating gate 76 and tunnel oxide layer 74 down to the surface of the N-well 72.

Figure 6E:
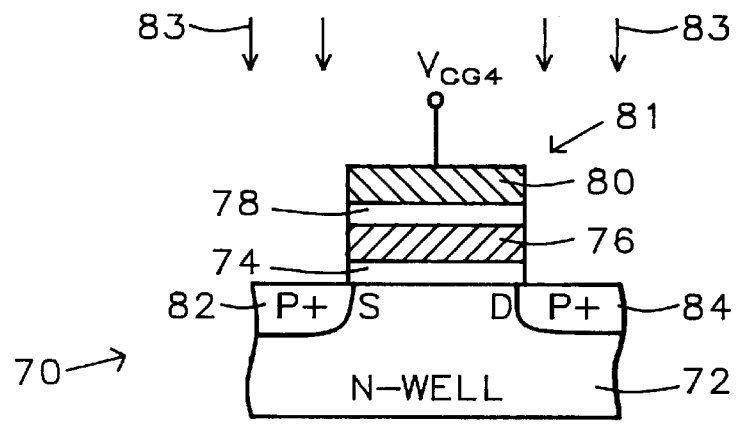

FIG. 6E shows the flash EPROM device 70 of FIG. 6E after the mask 81' has been stripped away and showing doping with source/drain dopant 83 comprising boron fluoride ($BF_2$) P+ dopant ion-implanted into the source/drain regions 82/84 in N-well 72 (at an energy from about 30 keV to about 60 keV with a dose from about 1 E 15 ions/cm$^2$ to about 5 E 15 ions/cm$^2$). The gate electrode stack 81 of polysilicon film 80, dielectric layer 78, floating gate electrode 76 and tunnel oxide layer 74 serve as a self-aligned mask in forming the P+ source/drain regions 82/84 in the N-well 72. After annealing, the source/drain regions 82/84 have a concentration of P+ dopant from about 1 E 18 atoms/cm$^3$ to about 1 E 20 atoms/cm$^3$.

Figure 6F:
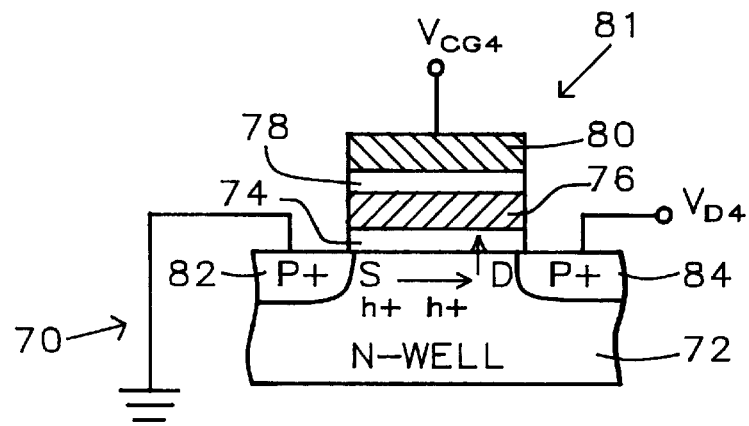

FIG. 6F shows the flash EPROM device 70 of FIG. 6E after the subsequent steps in completion of the flash EPROM device 70 seen in FIG. 4A with the terminals connected to the device.

Then the back end of the line steps follow to complete the manufacture of the flash EPROM device 70 as will be well understood by those skilled in the art.

While this invention has been described in terms of the above specific embodiments), those skilled in the art will The source/drain regions 82/84 are symmetrically self-aligned with the gate electrode stack 81. recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming an FET semiconductor device in a doped silicon semiconductor substrate having a surface, said substrate comprising an N-well doped with a first, N-type of dopant, by the steps comprising:

forming a tunnel oxide layer over said substrate, then forming a floating gate electrode layer comprising a polysilicon layer over said tunnel oxide layer and then doping said floating gate electrode layer with said first, N-type of dopant, then forming an interelectrode dielectric layer over said floating gate electrode, then forming a control gate electrode layer including a layer composed of polysilicon over said interelectrode dielectric layer and then counterdoping said control gate electrode with an opposite, P-type of dopant, then forming a mask and etching away exposed portions of said control gate electrode layer, said interelectrode dielectric layer and, said floating gate electrode layers thereby patterning said tunnel oxide layer, said floating gate electrode layer, said interelectrode dielectric layer, and said control gate electrode layer into a gate electrode stack, and then performing an ion implanting doping step in which a source region and a drain region in said surface of said substrate are doped with said opposite, P-type of source/drain dopant symmetrically self-aligned with said gate electrode stack, whereby said source region and said drain region are self-aligned with said gate electrode stack.

2. The method of claim 1 wherein:
said floating gate electrode layer is a laminated structure comprising:
an undoped lower polysilicon layer,
said doped polysilicon layer formed on said lower polysilicon layer, and
an undoped upper polysilicon layer formed on said doped polysilicon layer.

3. The method of claim 1 wherein:
said source/drain dopant comprises P type dopant ions of boron fluoride, $BF_2$, ion-implanted at an energy from about 30 keV to about 60 keV with a dose from about $1\ E\ 15$ ions/cm$^2$ to about $5\ E\ 15$ ions/cm$^2$.

4. The method of claim 1 wherein:
said floating gate electrode layer has a thickness from about 1,000 Å to about 1,200 Å.

5. The method of claim 1 wherein said floating gate electrode layer is a laminated structure comprising:
a lower, undoped polysilicon layer having a thickness from about 1,000 Å to about 1200 Å,
an N+ doped polysilicon layer formed on said lower polysilicon layer having a thickness from about 1,000 Å to about 1200 Å, and
an upper, undoped polysilicon layer having a thickness from about 2,000 Å to about 3,000 Å.

6. The method of claim 1 wherein:
said floating gate electrode layer is a laminated structure comprising an undoped lower polysilicon layer,
an N+ doped polysilicon layer formed on said lower polysilicon layer, and an undoped upper polysilicon layer, and said tunnel oxide layer has a thickness from about 90 Å to about 100 Å.

7. The method of claim 1 wherein:
said floating gate electrode layer is a laminated structure comprising an undoped lower polysilicon layer, an N+ doped polysilicon layer formed on said lower polysilicon layer, and an undoped upper polysilicon layer, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about $1\ E\ 15$ ions/cm$^2$ to about $5\ E\ 15$ ions/cm$^2$.

8. The method of claim 1 wherein:
said floating gate electrode layer is a laminated structure comprising an undoped lower polysilicon layer having a thickness from about 1,000 Å to about 1,200 Å, an N+ doped polysilicon layer formed on said lower polysilicon layer having a thickness from about 1,000 Å to about 1,200 Å, and an undoped upper polysilicon layer having a thickness from about 2,000 Å to about 3,000 Å, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about $1\ E\ 15$ ions/cm$^2$ to about $5\ E\ 15$ ions/cm$^2$.

9. The method of claim 1 wherein:
said floating gate electrode layer is a laminated structure comprising a lower polysilicon undoped layer having a thickness from about 1,000 Å to about 1,200 Å, an N+ doped polysilicon layer formed on said lower polysilicon layer having a thickness from about 1,000 Å to about 1,200 Å, and an undoped upper polysilicon layer having a thickness from about 2,000 Å to about 3,000 Å, said tunnel oxide layer has a thickness from about 90 Å to about 100 Å, and said sour ce/drain dopant comprises P type dopant ions of boron fluoride, $BF_2$, ion-implanted at an energy from about 30 keV to about 60 keV with a dose from about $1\ E\ 15$ ions/cm$^2$ to about $5\ E\ 15$ ions/cm$^2$, and said substrate is doped by N type dopant comprising ions of phosphorus, P, ion-implanted at an energy from about 70 keV to about 100 keV with a dose from about $7\ E\ 12$ ions/cm$^2$ to about $1.4\ E\ 13$ ions/cm$^2$.

10. A method of forming a split gate FET semiconductor device in a doped silicon semiconductor substrate having a surface, said substrate being doped with a first type of dopant, said device having a channel, said channel having a channel width, by the steps comprising:

forming a tunnel oxide layer over said substrate, then forming a floating gate electrode layer including a first doped polysilicon layer with said first type of dopant over said tunnel oxide layer, patterning said floating gate electrode layer into a split gate floating gate electrode have a narrower width than said channel width, then forming an interelectrode dielectric layer over said floating gate electrode and the exposed portion of said tunnel oxide, then forming a control gate electrode layer including a layer composed of polysilicon counterdoped with an opposite type of dopant from said first type of dopant over said interelectrode dielectric layer, then forming a mask and etching away exposed portions of said control gate electrode layer, said interelectrode dielectric layer, and said floating gate electrode layer, thereby patterning said tunnel oxide layer, said floating gate electrode layer, said interelectrode dielectric layer, and said control gate electrode into a gate electrode stack above said channel, and then performing a self-aligned ion implanting doping step in which a source region and a drain region in said surface of said substrate are doped with said opposite type of source/drain dopant symmetrically self-aligned with said gate electrode stack, whereby said source region and said drain region are self-aligned with said gate electrode stack of said split gate FET semiconductor device.

11. The method of claim 10 wherein said floating gate electrode layer is a laminated structure comprising:

an undoped lower polysilicon layer, said first doped polysilicon layer formed on said lower polysilicon layer, and an undoped upper polysilicon layer formed on said counterdoped polysilicon layer.

12. The method of claim 10 wherein:

said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

13. The method of claim 10 wherein:

said floating gate electrode layer has a thickness from about 1,000 Å to about 1,200 Å.

14. The method of claim 10 wherein:

said floating gate electrode layer is a laminated structure comprising an undoped lower polysilicon layer having a thickness from about 1,000 Å to about 1,200 Å, a doped polysilicon layer formed on said lower polysilicon layer having a thickness from about 1,000 Å to about 1,200 Å, and an undoped upper polysilicon layer having a thickness from about 2,000 Å to about 3,000 Å.

15. The method of claim 10 wherein:

said floating gate electrode layer is a laminated structure comprising an undoped lower polysilicon layer, a doped polysilicon layer formed on said lower polysilicon layer, and an undoped upper polysilicon layer, and said tunnel oxide layer has a thickness from about 90 Å to about 100 Å.

16. The method of claim 10 wherein:

said floating gate electrode layer is a laminated structure comprising an undoped lower polysilicon layer, a doped polysilicon layer formed on said lower polysilicon layer, and an undoped upper polysilicon layer, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

17. The method of claim 10 wherein:

said floating gate electrode layer is a laminated structure comprising an undoped lower polysilicon layer having a thickness from about 1,000 Å to about 1,200 Å, an N+ doped polysilicon layer formed on said lower polysilicon layer having a thickness from about 1,000 Å to about 1,200 Å, and an undoped upper polysilicon layer having a thickness from about 2,000 Å to about 3,000 Å, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

18. The method of claim 10 wherein:

said substrate is doped by N type dopant comprising ions of phosphorus, P, ion-implanted at an energy from about 70 keV to about 100 keV with a dose from about 7 E 12 ions/cm$^2$ to about 1.4 E 13 ions/cm$^2$.

19. A method of forming an FET semiconductor device in a doped silicon semiconductor substrate having a surface, said substrate being doped with a first type of dopant by the steps comprising:

forming a tunnel oxide layer over said substrate, then forming floating gate electrode layers over said tunnel oxide layer, by the steps comprising:

a) forming a lower, undoped polysilicon layer, b) then forming a doped polysilicon layer formed on said lower polysilicon layer doped with said first type of dopant, and c) then forming an upper, undoped polysilicon layer formed on said doped polysilicon layer, then forming an interelectrode dielectric layer over said floating gate electrode layers, then forming a control gate electrode layer composed of polysilicon counterdoped with an opposite type of dopant from said first type of dopant over said interelectrode dielectric layer, then forming a mask and etching away exposed portions of said control gate electrode layer, said interelectrode dielectric layer, and said floating gate electrode layers thereby patterning said tunnel oxide layer, said floating gate electrode layers, said interelectrode dielectric layer, and said control gate electrode layer into a gate electrode stack, and then performing a self-aligned ion implanting doping step in which a source region and a drain region are formed by doping into said surface of said substrate with said opposite type of source/drain dopant symmetrically self-aligned with said gate electrode stack, whereby said source region and said drain region are self-aligned with said gate electrode stack.

20. The method of claim 19 wherein:

said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

21. The method of claim 19 wherein said doped floating gate electrode layer has a thickness from about 1,000 Å to about 1,200 Å.

22. The method of claim 19 wherein said floating gate electrode layers are a laminated structure comprising:

said lower, undoped polysilicon layer which has a thickness from about 1,000 Å to about 1200 Å, said N+ doped polysilicon layer which has a thickness from about 1,000 Å to about 1200 Å, and said upper, undoped polysilicon layer which has a thickness from about 2,000 Å to about 3,000 Å.

23. The method of claim 19 wherein:

said floating gate electrode layers are a laminated structure comprising an undoped lower polysilicon layer, an N+ doped polysilicon layer formed on said lower polysilicon layer, and an undoped upper polysilicon layer, and said tunnel oxide layer has a thickness from about 90 Å to about 100 Å.

24. The method of claim 19 wherein:

said floating gate electrode layers are a laminated structure comprising an undoped lower polysilicon layer, an N+ doped polysilicon layer formed on said lower polysilicon layer, and an undoped upper polysilicon layer, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

25. The method of claim 19 wherein:

said floating gate electrode layers are a laminated structure comprising:
   a) an undoped lower polysilicon layer having a thickness from about 1,000 Å to about 1,200 Å,
   b) an N+ doped polysilicon layer formed on said lower polysilicon layer having a thickness from about 1,000 Å to about 1,200 Å, and
   e) an undoped upper polysilicon layer having a thickness from about 2,000 Å to about 3,000 Å, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

26. The method of claim 19 wherein:

said floating gate electrode layers are a laminated structure comprising:
   a) said lower polysilicon undoped layer which has a thickness from about 1,000 Å to about 1,200 Å,
   b) said doped polysilicon layer formed on said lower polysilicon layer which has a thickness from about 1,000 Å to about 1,200 Å, and
   c) said undoped upper polysilicon layer which has a thickness from about 2,000 Å to about 3,000 Å, said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$, and said substrate is doped by N type dopant comprising ions of phosphorus, P, ion-implanted at an energy from about 70 keV to about 100 keV with a dose from about 7 E 12 ions/cm$^2$ to about 1.4 E 13 ions/cm$^2$.

27. A method of forming a split gate FET semiconductor device in a doped silicon semiconductor substrate having a surface, said substrate being doped with a first type of dopant, said device having a channel, said channel having a channel width, by the steps comprising:

forming a tunnel oxide layer over said substrate, then forming floating gate electrode layers over said tunnel oxide layer, comprising forming a lower, undoped polysilicon layer, forming a doped polysilicon layer doped with said first type of dopant on said lower polysilicon layer, and forming an upper, undoped polysilicon layer formed on said doped polysilicon layer, patterning said floating gate electrode layer into a split gate floating gate electrode have a narrower width than said channel width, then forming an interelectrode dielectric layer over said floating gate electrode layers and the exposed portion of said tunnel oxide, then forming a control gate electrode including a layer composed of polysilicon counterdoped with an opposite type of dopant from said first type of dopant over said interelectrode dielectric layer, then forming a mask and etching away exposed portions of said control gate electrode layer, said interelectrode dielectric layer, and said floating gate electrode layers thereby patterning said tunnel oxide layer, said floating gate electrode layers, said interelectrode dielectric layer, and said control gate electrode layer into a gate electrode stack above said channel, and then performing a self-aligned ion implanting doping step in which a source region and a drain region are forming by doping into said surface of said substrate with said opposite type of source/drain dopant symmetrically self-aligned with said gate electrode stack, and whereby said source region and said drain region are self-aligned with said gate electrode stack of said split gate FET semiconductor device.

28. The method of claim 27 wherein:

said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

29. The method of claim 27 wherein:

said floating gate electrode layer has a thickness from about 1,000 Å to about 1,200 Å.

30. The method of claim 27 wherein:

said floating gate electrode layers are a laminated structure comprising:

an undoped lower polysilicon layer which has a thickness from about 1,000 Å to about 1,200 Å, a doped polysilicon layer formed on said lower polysilicon layer which has a thickness from about 1,000 Å to about 1,200 Å, and an undoped upper polysilicon layer which has a thickness from about 2,000 Å to about 3,000 Å.

31. The method of claim 27 wherein:

said tunnel oxide layer has a thickness from about 90 Å to about 100 Å.

32. The method of claim 27 wherein:

said tunnel oxide layer has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

33. The method of claim 27 wherein:

said floating gate electrode layers are a laminated structure comprising:

said undoped lower polysilicon layer which has a thickness from about 1,000 Å to about 1,200 Å, said doped polysilicon layer formed on said lower polysilicon layer which has a thickness from about 1,000 Å to about 1,200 Å, and said undoped upper polysilicon layer which has a thickness from about 2,000 Å to about 3,000 Å, said tunnel oxide layer which has a thickness from about 90 Å to about 100 Å, and said source/drain dopant comprises P type dopant ions of boron fluoride, $BF_2$, ion-implanted at an energy from about 30 keV to about 60 keV with a dose from about 1 E 15 ions/cm$^2$ to about 5 E 15 ions/cm$^2$.

34. The method of claim 27 wherein:

said substrate is doped by N type dopant comprising ions of phosphorus, P, ion-implanted at an energy from about 70 keV to about 100 keV with a dose from about 7 E 12 ions/cm$^2$ to about 1.4 E 13 ions/cm$^2$.

* * * * *